United States Patent [19]

Ames

[11] 4,413,157
[45] Nov. 1, 1983

[54] HYBRID PHOTOVOLTAIC-THERMAL DEVICE

[76] Inventor: Douglas A. Ames, 1301 20th St., NW., Washington, D.C. 20036

[21] Appl. No.: 276,824

[22] Filed: Jun. 24, 1981

Related U.S. Application Data

[63] Continuation-in-part of Ser. No. 242,101, Mar. 9, 1981, Pat. No. 4,389,533.

[51] Int. Cl.³ .......................... H01L 31/04; F24J 3/02
[52] U.S. Cl. ..................................... 136/248; 136/246; 136/251
[58] Field of Search ....................... 136/246, 248, 251

[56] References Cited

U.S. PATENT DOCUMENTS

| | | | |
|---|---|---|---|
| 3,150,999 | 9/1964 | Rudenberg et al. | 136/256 |
| 4,104,083 | 8/1978 | Hirano | 136/259 |
| 4,130,445 | 12/1978 | Blieden | 136/247 |
| 4,149,903 | 4/1979 | Lindmayer | 136/246 |

FOREIGN PATENT DOCUMENTS 1455903  11/1976  United Kingdom ................ 136/256

OTHER PUBLICATIONS

J. W. Stultz, "Thermal & Other Tests of Photovoltaic Modules Performed in Natural Sunlight", Doe/JPL. Low-Cost Solar Array Project 5101-76, Jul. 1978, pp. 5-9 to 5-12 and 6-2 to 6-3.
A. B. Meinel et al., "Applied Solar Energy", Addison-Wesley Pub. Co., (1976), pp. 470-471.

*Primary Examiner*—Aaron Weisstuch
*Attorney, Agent, or Firm*—Watson, Cole, Grindle & Watson

[57] ABSTRACT

An improved photovoltaic device including a solar panel and a container housing salt hydrate materials, in which the container is positioned in close proximity to the lower portion of the panel, which has no support-providing bottom wall, so that heat generated during operation of the photovoltaic cells will pass easily to the container for the salt hydrate materials, thus lowering the operating temperature of the cells.

9 Claims, 3 Drawing Figures

U.S. Patent  Nov. 1, 1983  4,413,157
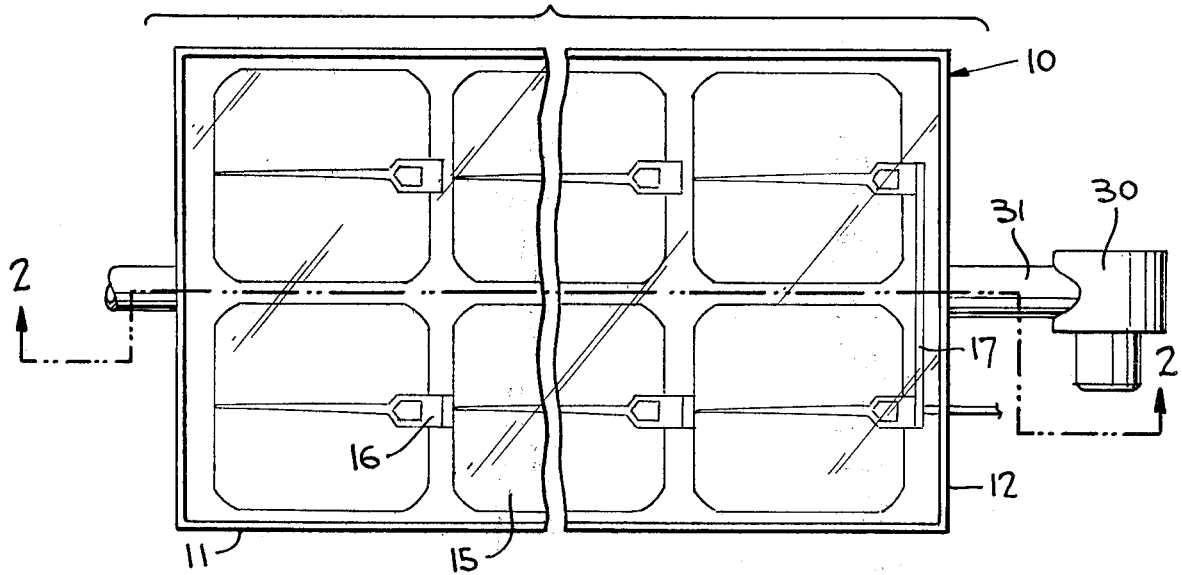
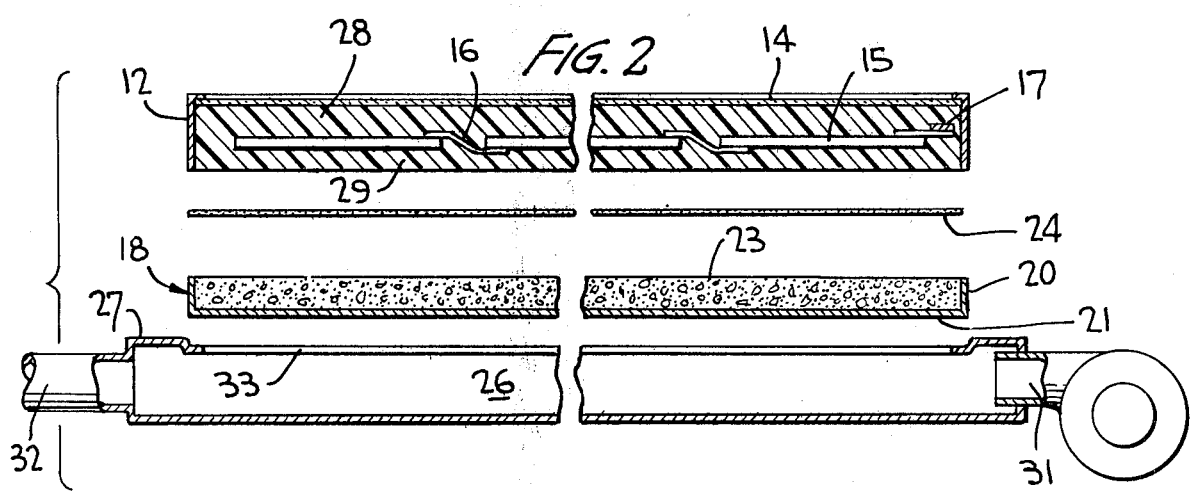
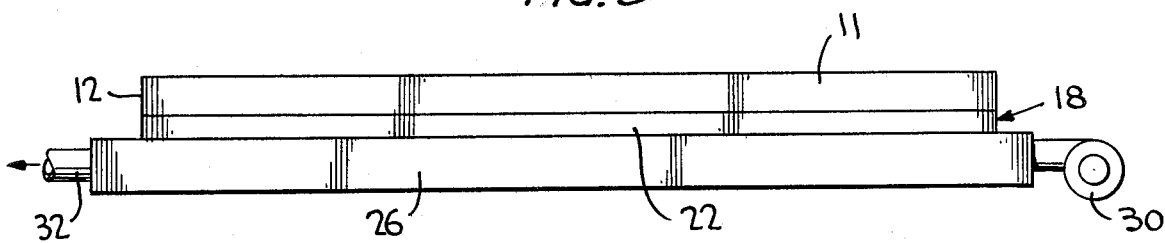

HYBRID PHOTOVOLTAIC-THERMAL DEVICE

This application is a continuation-in-part of my copending application Ser. No. 242,101, filed Mar. 9, 1981 and entitled, Photovoltaic Device for Producing Electrical and Heat Energy, now U.S. Pat. No. 4,389,533.

The present invention relates generally to photovoltaic devices, which include so-called solar cells and housings for those cells. More particularly, it relates to solar panels that hold photovoltaic cells in position to receive light impinging thereon, and to protect those cells from rough handling and possibly destructive ambient conditions.

As set forth in my application Ser. No. 242,101, filed Mar. 9, 1981, photovoltaic cells perform less efficiently at higher temperatures. Consequently, that prior application was directed toward a combination of a solar panel and a container housing salt hydrate materials. The salt hydrate materials were so positioned with respect to the solar panel that the heat of the photovoltaic cells within the panel would cause a melting of the salt hydrate materials which, on changing from solid to liquid phase, absorbed considerable thermal energy.

While the combination of solar panel and container for salt hydrate materials disclosed and claimed in my co-pending application is an effective way of removing heat from the vicinity of photovoltaic cells, it has since been discovered that modifications may be made in the solar panels that enable the transfer of heat to be more readily made from the situs of the photovoltaic cells to the salt hydrate materials in their container without unnecessary barriers. In some cases, solar panels employing these improvements are already on the market. For example, solar panels that have no rigid bottom wall, as such, but have a layer of encapsulating resin either exposed at the bottom of the panel or covered by a thin, non-structural sheet are already being marketed.

As a consequence, it is a prime object of the present invention to provide the combination of a solar panel and a container for salt hydrate materials in which the passage of heat from the vicinity of the cells to the salt hydrate materials will be ameliorated, preferably with little modification of solar panels commercially available today.

As an improvement over my prior U.S. application Ser. No. 242,101, I have now discovered that, as such, there is no requirement that the solar panel to be used in close proximity to the container housing salt hydrate materials have a lower, support-providing bottom wall. Further, in some instances where the cells have mounted between them and the salt hydrate materials, a film resistant to corrosion from salts, it is even possible to have a container for the salt hydrate materials that has no top. Thus, according to the present invention, the solar panel will be formed with an enclosure having upper and lower portions with the cells mounted in the enclosure between those portions. The container for salt hydrate materials is positioned in proximity to the lower portion of the enclosure so that heat generated during operation of the photovoltaic cells will pass to and through that lower portion and melt the salt hydrate materials, thereby effectively storing heat in those materials and lowering the operating temperature of the cells with minimal inhibition from the structure of the solar panel.

There are many improvements on this basic concept that are desired to be included within the scope of the present invention. Thus, the solar cells may be positioned on a film of cushioning material, e.g., a resin, located immediately beneath them and, if the salt hydrate materials container has a top, that top would be located closely adjacent to the film. Preferably, the film has adhesive properties to hold that top in position, although the adhesive film that cushions the cells can have its adhesive function effective even in the absence of a top to the salt hydrate materials container.

Among other modifications of the basic invention are the use of a thermally conductive grease or adhesive between the cells or an underlying film, and the salt hydrate materials container. Indeed, the film that cushions the solar cells can itself be a thermally conductive adhesive. The film may or may not provide substantial structural support for the cell.

As set forth in my prior application, one important use of the combination disclosed and claimed both there and here, is that the salt hydrate materials can be used not only to lower cell temperature, and thereby improve efficiency of the solar panel, but, the retained heat in the salt hydrate materials container can, itself, be utilized. Thus, means may be provided for distributing the heat from that container to locations remote therefrom. Exemplarily, the means for distributing heat from the salt hydrate materials container may comprise a duct having a fluid therein, e.g., air, and the container positioned so that its bottom and even its sides are in the path of the fluid in the duct. An impeller may be provided for passing that fluid into and out of contact with the bottom and sides of the container.

There are still other aids that may be used to increase the efficiency of the combination so far as the transfer of heat from the solar panel to the salt hydrate materials container pertains. Thus, while it is already known in the art that an anisotropic etching of the surface of photovoltaic cells can produce various groved patterns or upstanding pyramids to reflect light to other portions of the front surface of a cell rather than away from the cell and out of the solar panel without absorption and consequent generation of electricity, such etched cells do result in the generation of added heat. Textured, i.e., etched surfaces, result in absorption of longer wavelength light, and so more heat is generated. Thus, textured cells are particularly adapted to be used in conjunction with salt hydrate materials, because the added heat so generated will be absorbed and contained by the salt hydrate materials. As another example, while photovoltaic cells do normally have a network or grid that forms their front contact, the back contact of the cells is normally continuous. However, gridded back contacts can serve to permit relatively long wavelength radiation to pass through the cell without reflection and generation of heat; consequently, gridded back contact solar cells also are particularly adapted to be used in the present invention, especially when a textured front surface is used. As still another example, where a container for the salt hydrate materials is provided with a top, either painting the top black or forming it from a black material has been determined to aid in the transfer of heat from the bottom portion of the solar panel enclosure to the salt hydrate materials positioned within their container.

A further advantage has occurred to me with regard to a structure embodying a combination of a solar panel and a container housing salt hydrate materials in addition to a lowering of the solar cell temperature and the collection and storage of thermal energy within the salt hydrate materials' latent heat of fusion. It is well known to those of skill in this art that the various components of a solar panel, e.g., the silicon wafer, the front and back contacts, the encapsulating resin and the cover glass, will have different coefficients of thermal expansion and these properties may cause accelerated degradation of the solar panel when it is exposed to wide temperature variations characteristic of many ambient conditions. The use of salt hydrate materials will cause a reduction in the usual thermal cycling of a solar panel and thus will tend to aid the panel in resisting environmental degradation. Indeed, the use of salt hydrate materials may even allow certain components of the solar panel to be used, which components could not be used previously due to widely varying coefficients of thermal expansion.

These and other objects, features and advantages of the present invention will become more apparent to those of skill in this art when considered in conjunction with a best mode of my invention as described in the specification hereinafter and as illustrated in the accompanying drawing, in which:

FIG. 1 is a top plan view, partly broken away, of a preferred embodiment of my device;

FIG. 2 is an exploded, vertical sectional view of the device of FIG. 1, taken along the line 2—2 thereof, and FIG. 3 is a side elevational view of the device of FIGS. 1 and 2.

Referring now to the drawing, and more particularly to FIG. 1 thereof, what is there illustrated is substantially what was illustrated in the corresponding FIG. 1 view of my copending, parent application. It will there be seen that a solar panel, indicated generally by reference numeral 10, has side walls 11 and end walls 12. The upper portion of the panel is open to the passage of light therethrough, terminating in a plate 14 of glass or other light-permeable material. Mounted within the solar panel 10 are a plurality of photovoltaic cells 15, interconnected by contacts 16 and leading to a busbar 17 in a manner well-known to those of skill in this art. The solar cells 15 illustrated in the top plan view of FIG. 1 are substantially square in shape rather than circular, a square of rectangular shape having a greater panel fill factor or packing factor, which is the percentage of the total area of a panel occupied by cells. As a consequence, more heat is generated than by panels having lesser packing factors. As will be reasonably apparent, the greater the heat generated per unit of surface area of a solar panel, the more advantageous will be the use of my salt hydrate materials to remove heat from the immediate vicinity of the solar cells. Thereby, the temperatures of the cells will be reduced and their efficiency improved.

Referring now in particular to FIG. 2 of the drawing, according to the best mode of the present invention the solar panel 10 is formed with an enclosure defined by side walls 11 and end walls 12, the former being more apparent in the side elevation of FIG. 3. As shown in FIG. 2, however, the solar panel and its enclosure have no bottom wall. While the panel, in section, shows the cells 15 joined by interconnects 16 and busbar 17, as well as encapsulant 28 above and 29 below the cells 15, there is no bottom wall to the enclosure housing the cells.

Referring now to the container for the salt hydrate materials, which are illustrated as being in granular form by reference numeral 23, that salt hydrate materials container 18 has end walls 20 and a bottom 21, as well as side walls 22, best seen in FIG. 3. What has been referred to as salt hydrate materials will be described in greater detail hereinafter.

FIG. 2 is an exploded sectional view showing the relationship between the solar panel 10 and the salt hydrate materials container 18. Illustrated between those two containers is a film 24 that serves to unite the panel and the container. This film 24 is a thermal grease or adhesive that unifies the salt hydrate materials container 18 and its contents to the solar panel 10 and its contents. I presently contemplate that if the layer 24 is an adhesive, it can be the thermally conductive adhesive such as that marketed under the trademark CAS-COAT CC-1200, a black, thermally conductive RTV adhesive. Where film 24 is a thermal grease, I presently contemplate as part of my best mode that such grease will be a General Electric Silicone grease such as number G-641, which is a high thermal conductivity compound marketed by Read Plastics, of Rockville, Md.

With respect to the salt hydrate materials 23, I do not with to be limited to any particular salt hydrate materials, so long as they are operative. Where a specific melting point that differs from the melting point of any single salt hydrate material is deemed advantageous, no single salt hydrate material, itself, will suffice. There are certain salt hydrate materials that are presently deemed to be most desirable. To be commercially marketable, salt hydrate materials must meet safety and performance standards, have a reasonable life expectancy, and be available in sufficient quantities and at reasonable cost to be used in bulk. While not all salt hydrate materials meet this requirement, many do, and I specifically refer to sodium sulfate decahydrate, $Na_2SO_4.10H_2O$, most commonly known as Glauber's salt, as one of the least expensive and most available hydrates suitable for use here. Glauber's salt melts at approximately 90° F. and has a relatively high heat of fusion of 108 BTU/lb. As will be recognized by those of skill in the art, it is ordinarily requisite that a nucleating agent, such as borax, be used with Glauber's salt. Also another agent to prevent stratification of the salt on cycling through liquid-solid-liquid, etc. cycles, should be provided. Other salt hydrates that appear to have use within the scope of my invention include calcium chloride hexahydrate, which has a melting point of about 81° F. and a heat of fusion of about 75 BTU/lb.

With specific respect to the structure of the enclosure formed by the solar panel 10 and the container 18 for the salt hydrate materials, it will be apparent that, regarding the scope of the present invention, either, but not both, may be formed with a dividing wall, that is, the salt hydrate material container 18 may have a top wall, or the solar panel enclosure may have a bottom wall. However, I have determined that it is unnecessary that each have a wall that encloses its contents entirely. I presently contemplate that it is most advantageous for the salt hydrate material container 18 to have a top wall, if for no other reason than to keep water of hydration from escaping when the contents of container 18 are in the liquid form. However, it is not at all necessary for the solar panel to have a bottom wall.

As illustrated in FIG. 2, should the structure of the interior of the solar panel permit, the bottom wall will not be required. By stating that it will depend on the structure of the interior of the solar panel, I mean to refer to the consistency of the material, such as a resin or plurality of resins, used to encapsulate the cells. If those resins have sufficient rigidity, such as do many silicone resins presently available, it will not be necessary to have a bottom wall for the solar panel 10. As a consequence, there will be no bottom wall that will obstruct or inhibit the free passage of heat from the solar cells 15 through the encapsulant 29 beneath the cells to the salt hydrate materials 23 in their container 18, which may or may not have a top, not illustrated. As a variant, a film 24 of thermally conductive grease or adhesive may be provided between the panel 10 and container 18, or the resin beneath the solar cells 15 may itself be a thermally conductive adhesive, in which case film 24 need not be used. In what may ultimately be the most preferred embodiment of my invention, the container 18 housing the salt hydrate materials may be directly adhered to the thermally conductive adhesive utilized as an encapsulant 29 beneath the solar cells 15. Since it does appear desirable to remove the bottom wall of the enclosure formed by the solar panel 10, which includes a glass surface 14, side walls 11 and end walls 12, it will only be possible to remove that bottom wall when the solar cells can be maintained, either by the encapsulant or otherwise, within the solar panel 10 without the need for a bottom support.

Recently a solar cell structure which has been denominated as a superstrate design, has received some attention. In a superstrate structure such as that illustrated in a Jet Propulsion Laboratory publication entitled, Electricity from Photovoltaic Solar Cells, Low Cost Solar Array Project, as Displayed at the 15th Photovoltaic Specialist Conference, May, 1981, the structural support for the solar cells comes from that portion of the panel above the cells rather than below them, the latter being denominated as a substrate design. A superstrate structure, of which I do not claim to be the inventor, is particularly advantageous for use in conjunction with my salt hydrate materials container, because then that portion of the solar panel beneath the photovoltaic cells can have as its prime purpose to enable heat to be conducted from the solar cells downwardly and away from the cells in the direction of the salt hydrate materials 23, rather than serving to support the cells.

As has also been illustrated in my parent application, still another use of my device, in addition to using salt hydrate materials to reduce the operating cell temperatures and thereby increase the efficiency of the cells of a solar panel, is to have the capability of storing heat for later use, such as to heat a home of which panels and salt hydrate materials containers according to my invention form a part of the roof. Illustrated in FIGS. 2 and 3 is a mode of utilizing heat stored in the salt hydrate materials 23. A duct indicated generally by reference numeral 26 may be used. Impeller means 30 is located so as to blow air or other fluid into connecting tube 31, through conduit 26 and then out exit passageway 32. As contemplated by the present invention, the top wall 27 of conduit 26 may have a cut-out portion thereof, indicated generally by reference numeral 33. The cut-out portion is so located that the container 18 housing the salt hydrate materials may be seated within that cut-out portion, with the bottom 21 of container 18 conforming to the top wall 27 of the duct 26. Alternatively, container 18 with at least parts of its side walls 22 and end walls 20 can be inserted into conduit 26.

In this manner heat can be transferred through the bottom wall 21 of container 18 directly to the fluid forced through duct 26 by impeller 30 into contact with bottom wall 21 and thence through exit 32 leading, perhaps, to the interior of a home. Thus, with minimal heat loss and with as great heat exchange capability as presently contemplated, fluid within duct 26 can be heated by the molten salt hydrate material shown in granular form in FIG. 2 and as indicated by reference numeral 23, to effect economic and rapid exchange of heat as that salt hydrate material freezes and, in changing from liquid to solid, emits heat.

There are other known changes in conventional structure of solar panels and cells that can aid in the transfer of heat and which are particularly adapted for use in conjunction with my salt hydrate materials. Thus, it is already known that anisotropic etching of the light-receiving surface of solar cells improves their efficiency by causing non-absorbed light impinging on the cells to be reflected to other portions of the cells for absorption, rather away from the cell. Textured cells result in the generation of additional heat. In addition, rather than having the back contact of the solar cells be comprised of a continuous layer of contact material, providing a gridded back contact, i.e., a back contact having open portions thereof, can allow heat which is generated by long wavelength light impinging on textured solar cells to be dissipated through the bottoms of the cells. Such heat will be removed by melting the salt hydrate materials. Also, it is contemplated that, in an embodiment in which the container for the salt hydrate materials has a top, that that top be either painted or coated black, or formed from a black material so as to aid in the transfer of the heat from the bottom portion of the solar panel enclosure to the salt hydrate materials positioned within container 18.

It will be apparent that certain modifications and alterations will be found obvious by those of skill in this art with respect to the device illustrated in the drawing and described hereinbefore in conjunction with the best mode of my invention. As to all such alterations and modifications, it is desired that they be included within the purview of my invention, which is to be limited only by the scope, including equivalents, of the terms of the following, appended claims.

I claim:

1. A photovoltaic device for transforming light energy into usable electrical energy, comprising
   (a) a solar panel having side walls forming an enclosure with an upper portion adapted to receive light therethrough, and a lower portion;
   (b) photovoltaic cells positioned in said enclosure beneath said upper portion and above said lower portion of said enclosure, said cells being enclosed in and supported and protected by an encapsulant and having light-receiving, upwardly facing surfaces and electrical contacts for collecting and channeling electrical energy generated by said cells to perform work;
   (c) said lower portion of said enclosure being free of any materials that substantially inhibit the passage of heat therethrough so that heat also generated during operation of said cells passes beneath said cells and into said lower portion of said enclosure, and
   (d) a container housing salt hydrate materials that are solid at ambient temperatures of use of said solar panel and can be melted by the heat generated during operation of said photovoltaic cells,
   (e) said container being positioned in proximity to said lower portion of said enclosure so that heat generated during the operation of said photovoltaic cells will pass freely to and through said lower portion of said enclosure and melt said salt hydrate materials, thereby effectively storing heat in said materials and lowering the operating temperature of said photovoltaic cells with minimal inhibition from the structure of said solar panel.

2. A photovoltaic device as claimed in claim 1, in which said salt hydrate materials container has a top and a bottom to retain said salt hydrate materials therewithin.

3. A photovoltaic device as claimed in claim 1, in which a thermally conductive grease or adhesive is located between said container and said solar panel.

4. A photovoltaic device as claimed in claim 1, in which said container housing said salt hydrate materials has side walls and a bottom, and said device further includes means for distributing heat from said container to locations remote therefrom.

5. A photovoltaic device as claimed in claim 4, in which said means for distributing heat comprises a duct having a fluid therein, and said container bottom is positioned at said duct and in the path of said fluid.

6. A photovoltaic device as claimed in claim 5, in which said container bottom is formed from a heat conductive material and in which said means for distributing heat further includes an impeller for passing said fluid in said duct into and out of contact with said container bottom.

7. A photovoltaic device as claimed in claim 2, in which said container top is black to aid in the transfer of heat from said bottom portion of said solar panel enclosure to said salt hydrate materials positioned within said container.

8. A photovoltaic device as claimed in claim 1, in which said photovoltaic cells have gridded back contacts.

9. A photovoltaic device as claimed in claim 1, in which said photovoltaic cells have front surfaces that have been anisotropically etched to form parts that reflect light impinging on said cell surface to other portions thereof.

* * * * *